United States Patent
Choi et al.

(10) Patent No.: US 10,636,674 B2
(45) Date of Patent: Apr. 28, 2020

(54) CONTROL METHOD OF DRY ETCHING APPARATUS

(71) Applicants: Sang Jun Choi, Seoul (KR); Ji Sung Kang, Jeollabuk-do (KR)

(72) Inventors: Sang Jun Choi, Seoul (KR); Ji Sung Kang, Gimje-si (KR); Kyung Jin Lee, Seoul (KR)

(73) Assignee: VAULT CREATION CO., LTD., Seoul (KR)

( * ) Notice: Subject to any disclaimer, the term of this patent is extended or adjusted under 35 U.S.C. 154(b) by 0 days.

(21) Appl. No.: 16/094,725

(22) PCT Filed: Apr. 18, 2017

(86) PCT No.: PCT/KR2017/004128
§ 371 (c)(1),
(2) Date: Oct. 18, 2018

(87) PCT Pub. No.: WO2017/183880
PCT Pub. Date: Oct. 26, 2017

(65) Prior Publication Data
US 2019/0103286 A1 Apr. 4, 2019

(30) Foreign Application Priority Data

Apr. 18, 2016 (KR) .................. 10-2016-0047035

(51) Int. Cl.
*H01L 21/3213* (2006.01)
*H01J 37/32* (2006.01)
(Continued)

(52) U.S. Cl.
CPC ........ *H01L 21/32136* (2013.01); *H01J 37/32* (2013.01); *H01J 37/32568* (2013.01);
(Continued)

(58) Field of Classification Search
None
See application file for complete search history.

(56) References Cited

U.S. PATENT DOCUMENTS

2001/0013504 A1* 8/2001 Imafuku ............. C23C 16/4405
216/71
2005/0257743 A1* 11/2005 Koshiishi .......... H01J 37/32082
118/723 E

FOREIGN PATENT DOCUMENTS

JP 2008-147659 6/2008
JP 5348919 11/2013
(Continued)

OTHER PUBLICATIONS

International Search Report for International Application No. PCT/KR2017/004128, dated Jul. 28, 2017.

*Primary Examiner* — Jiong-Ping Lu
(74) *Attorney, Agent, or Firm* — Kile Park Reed & Houtteman PLLC

(57) ABSTRACT

The present invention relates to a control method of a dry etching apparatus which can be applied regardless of materials. The control method of a dry etching apparatus may include: a work piece positioning step of positioning a work piece close to a surface of a cathode unit, facing an anode unit; a bidirectional voltage source applying step of applying a voltage to the cathode unit, the voltage having a polarity alternating between a positive voltage and a negative voltage with time; and an etching step of etching the surface of the work piece using plasma generated by the bidirectional voltage source applied to the cathode unit.

6 Claims, 7 Drawing Sheets

(51) Int. Cl.
    *H01L 21/67*         (2006.01)
    *H01L 21/687*       (2006.01)
    *H05H 1/46*         (2006.01)
    *H01L 21/311*       (2006.01)
    *H01L 21/3065*      (2006.01)
    *H01L 23/532*       (2006.01)

(52) U.S. Cl.
    CPC .... *H01L 21/3065* (2013.01); *H01L 21/31116* (2013.01); *H01L 21/32139* (2013.01); *H01L 21/6719* (2013.01); *H01L 21/67069* (2013.01); *H01L 21/67248* (2013.01); *H01L 21/68742* (2013.01); *H01L 21/68785* (2013.01); *H05H 1/46* (2013.01); *H01J 2237/002* (2013.01); *H01J 2237/334* (2013.01); *H01L 23/53228* (2013.01)

(56) References Cited

FOREIGN PATENT DOCUMENTS

| KR | 10-1999-0012395 | 2/1999 |
| KR | 10-0707120 | 4/2007 |
| KR | 10-2012-0085536 | 8/2012 |

\* cited by examiner (a)            (b)

CONTROL METHOD OF DRY ETCHING APPARATUS

TECHNICAL FIELD

The present disclosure relates to a control method of a dry etching apparatus, and more particularly, to a control method of a dry etching apparatus which can be applied regardless of materials.

BACKGROUND ART

An etching process is applied to process a semiconductor or various materials or products.

Such an etching process refers to a process of partially etching the surface of a work piece. As the etching process, a wet etching method using a chemical method is generally used.

Recently, the etching process is applied to various materials. However, there is a limitation on materials to which the wet etching method can be applied.

Therefore, a dry etching method has been introduced instead of the wet etching method.

FIG. 1 illustrates a process of etching copper (Cu) on a semiconductor using such a dry etching method.

First, a work piece having a hard mask 20 deposited on silicon 10 is subjected to a lithography process, and dry etching is performed on the hard mask 20.

Then, a photoresist (PR) film 30 formed during the lithography process is removed, and a Cu film 42 is then deposited in a vacuum chamber.

Then, Cu 44 is deposited on the deposited Cu film 42 through an electro-plating method. Then, the Cu 44 formed above the hard mask 20 is removed through a chemical-mechanical polishing (CMP) method.

Since the conventional dry etching method includes the chemical process, the number of processes is inevitably increased. Furthermore, since only a few volatile materials can be applied to the dry etching method, various materials cannot be applied to the dry etching method.

DISCLOSURE

Technical Problem

The present invention has been made to solve the problems occurring in the related art, and an object of the present invention is to provide a control method of a dry etching apparatus which can be applied to various materials without relying on a chemical process, and a control method thereof.

Technical Solution

In an embodiment, a control method of a dry etching apparatus may include: a work piece positioning step of positioning a work piece close to a surface of a cathode unit, facing an anode unit; a bidirectional voltage source applying step of applying a voltage to the cathode unit, the voltage having a polarity alternating between a positive voltage and a negative voltage with time; and an etching step of etching the surface of the work piece using plasma generated by the bidirectional voltage source applied to the cathode unit.

The work piece may be positioned in such a manner that the etched surface faces the bottom.

The bidirectional voltage source applied to the cathode unit may have a frequency lower than 1 MHz.

The control method may further include a distance adjusting step of adjusting the distance between the cathode unit and the anode unit, between the work piece positing step and the bidirectional voltage source applying step.

The distance between the cathode unit and the anode unit, which is adjusted at the distance adjusting step, may range from 3 mm to 50 mm.

The control method may further include a DC voltage applying step of applying a DC voltage to the anode unit, after or at the same time as the bidirectional voltage source applying step.

The DC voltage applied at the DC voltage applying step may range from 1% to 200% of the maximum voltage of the bidirectional voltage source applied at the bidirectional voltage source applying step.

The control method may further include a temperature control step of controlling the temperature of the cathode unit.

Advantageous Effects

According to the embodiment of the present invention, the control method of the dry etching apparatus can significantly reduce the etching process time than in the conventional dry etching method, thereby improving the productivity. Furthermore, the control method can perform dry etching on various materials and products regardless of materials, and prevent redeposition such that an etched portion can be cleanly formed without redeposition or contamination.

The effects of the present invention are not limited by the above-described effects, and other effects which are not described will be able to be understood by skilled in the art from the following descriptions.

MODE FOR INVENTION

Figure 1:
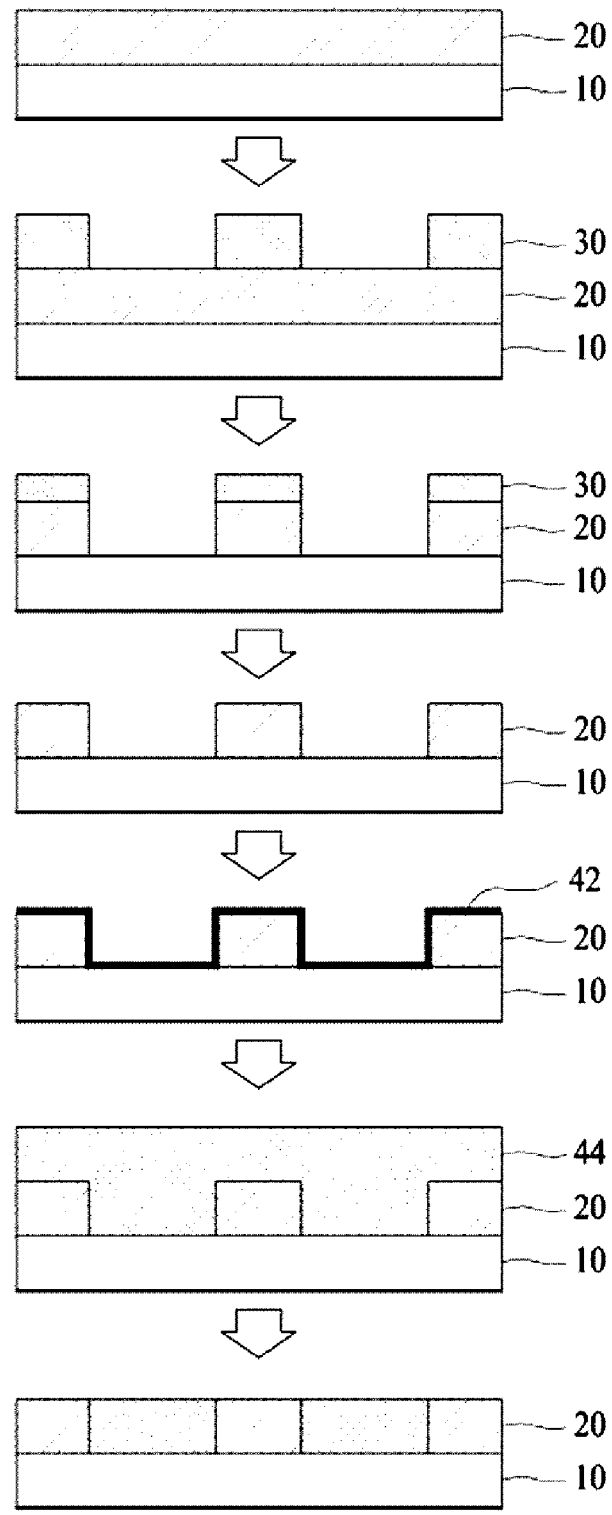
FIG. 1 illustrates a process of etching a Cu layer on a semiconductor using a conventional dry etching method.

Hereafter, exemplary embodiments which can implement the purpose of the present invention will be described in detail with reference to the accompanying drawings. Throughout the descriptions of the embodiments, like names and reference numerals are used for the same components, and additional descriptions thereof will be omitted.

In order to remove a limitation on materials in comparison to the conventional dry etching method described in the background, the present applicant has noticed that a high-energy ion source needs to hit a work piece harder, different process temperatures need to be applied depending on work pieces, and a process temperature difference needs to be maintained at a small value during a process of processing a work piece, when a process temperature is set. For example, the present applicant has noticed such aspects, in order to avoid hardening of photoresist (PR) which may occur when the temperature of the work piece exceeds 80° C. Furthermore, an etching yield difference caused by a process temperature difference during a process of processing a work piece can be suppressed, and setting control for various process temperature profiles can be performed. For example, the upper limit or lower limit temperature of some work piece materials can be set.

The present applicant has come up with the concept to expand a sheath region of plasma, to use a high voltage and a bidirectional voltage source of 1 MHz or less, and to improve plasma density, such that a high-energy ion source hits a work piece with higher kinetic energy.

Furthermore, in order to smoothly perform temperature control on a work piece, the present applicant has come up with the concept to insulate the work piece such that no current is applied to the work piece and to add a temperature control function to a cathode unit where the work piece is positioned. At this time, an insulator positioned close to the work piece may be bonded to a portion to which a bidirectional voltage source is applied, through an integrated coating technique or a bonding technique using a bonding material with an excellent heat transfer characteristic. Thus, temperature control can be smoothly performed while generated heat is rapidly discharged to a cooling unit.

Figure 2:
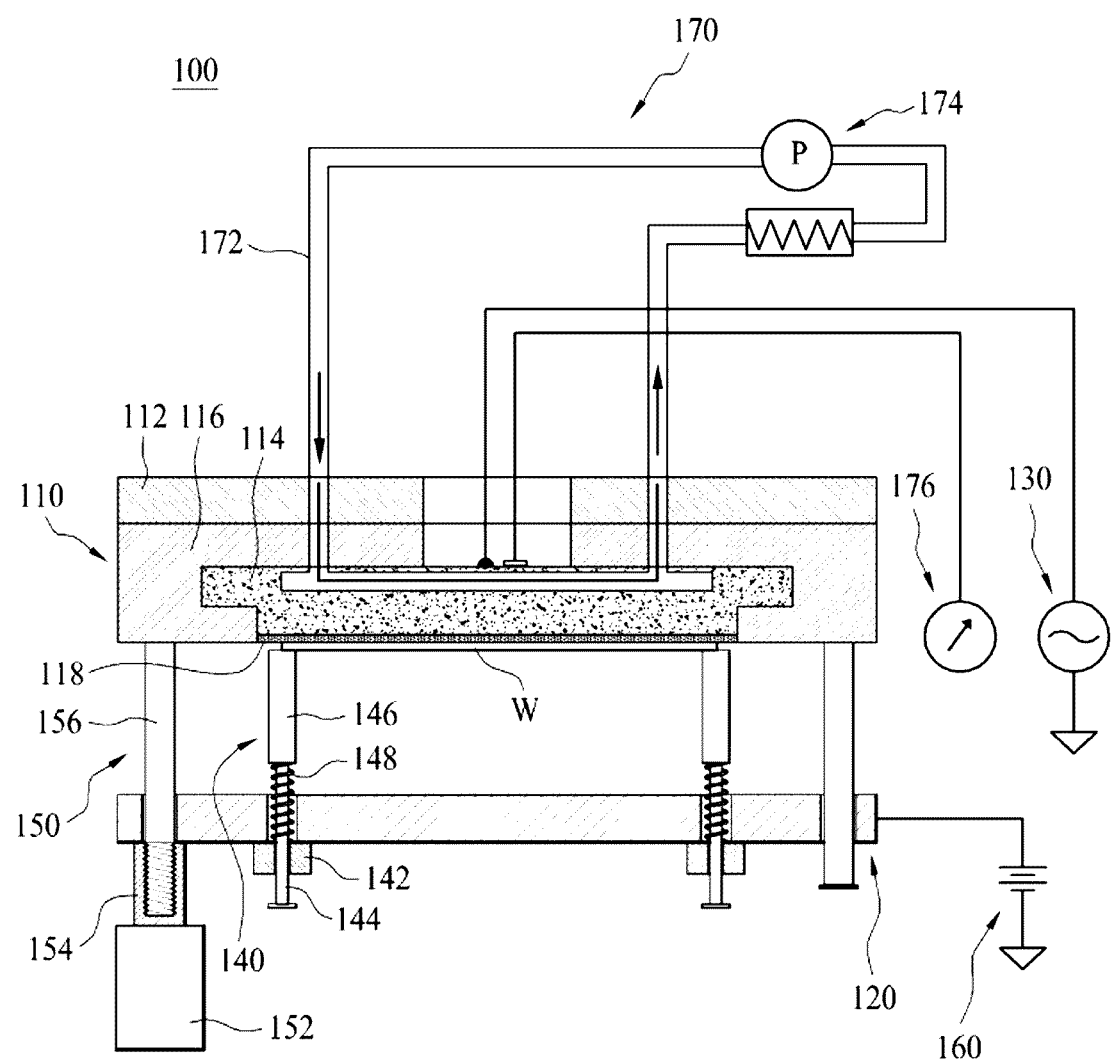
FIG. 2 is a cross-sectional view illustrating a dry etching apparatus according to an embodiment of the present invention.

As illustrated in FIG. 2, a dry etching apparatus 100 according to an embodiment of the present invention may include an anode unit 120, a cathode unit 110, a positioning unit 140 and a bidirectional voltage source supply unit 130.

The anode unit 120 and the cathode unit 110 are arranged in a housing (not illustrated) so as to be spaced apart from each other in the top-to-bottom direction.

The housing (not illustrated) forms a space in which various components described below are arranged, such that vacuum can be formed therein or gas such as argon (Ar) can be injected thereto. Furthermore, the housing can be opened/closed to put or take a work piece W into or out of the housing.

At this time, the cathode unit 110 may be disposed at the top, and the anode unit 120 may be disposed at the bottom.

In the following descriptions, the direction of the gravity may be set to the bottom, and the opposite direction thereof may be set to the top.

The bidirectional voltage source supply unit 130 may apply a bidirectional voltage source to the cathode unit 110.

At this time, the bidirectional voltage source may indicate a current in which the polarity of a voltage alternates between a positive voltage and a negative voltage in accordance with time.

The bidirectional voltage source may have a frequency of 1 MHz or less.

The applying of the bidirectional voltage source can increase the charge accumulation time, thereby contributing to expanding a sheath region. Since the expansion of the sheath region can secure the time required for accelerating ions toward the work piece, the ions can hit the surface of the work piece W with higher energy. The bidirectional voltage source will be described in detail below.

The work piece W may be positioned close to the bottom surface of the cathode unit 110, facing the anode unit 120.

Therefore, since etching is performed on the bottom surface of the work piece W, atoms separated from the surface of the work piece W through the etching may fall toward the anode unit 120 due to the gravity, which makes it possible to prevent the atoms from being redeposited on the surface of the work piece W.

The positioning unit 140 serves to position the work piece W close to the bottom surface of the cathode unit 110.

The dry etching apparatus may further include a distance adjusting unit 150 for adjusting the distance between the cathode unit 110 and the anode unit 120.

In general, the amount of charge Q is proportional to an applied voltage V, a dielectric constant ε and the area A of the work piece, and inversely proportional to the distance d between the cathode unit and the anode unit (Q=VεA/d).

Thus, as the distance adjusting unit 150 adjusts the distance between the cathode unit 110 and the anode unit 120, the constant or optimal amount of charge can be maintained even when a variety of work pieces W with various areas A are etched.

The distance adjusting unit 150 may include a motor 152, a coupling 154 and a support rod 156. The support rod 156 may be formed of an insulating material to minimize the influence on plasma between the cathode unit 110 and the anode unit 120.

The motor 152 serves to generate a rotational force. In the present embodiment, the case in which a step motor capable of finely adjusting a rotational angle is applied as the motor 152 will be taken as an example for description. The step motor may be controlled by a separately installed control unit 190.

The coupling 154 may be rotated by the rotational force of the motor 152, and have a through-hole formed coaxially with the central axis of rotation along the central axis of rotation, and the through-hole may have a screw thread formed on the inner circumferential surface thereof. At this time, the central axis of rotation of the coupling 154 may be formed in the top-to-bottom direction.

The support rod 156 is extended in the top-to-bottom direction, and has a screw thread formed on the outer circumferential surface thereof and engaged with the inner circumferential surface of the coupling 154. The support rod 156 is inserted into the through-hole of the coupling 154 so as to be engaged with the inner circumferential surface of the through-hole, and supports the cathode unit 110 at the top thereof.

Therefore, when the motor 152 is rotated, the coupling 154 is also rotated. Thus, the support rod 156 is moved upward/downward to an extent corresponding to the rotational angle of the motor 152 and the pitch of the coupling 154. Accordingly, while the cathode unit 110 supported by the top of the support rod 156 is also moved upward/downward, the distance between the cathode unit 110 and the anode unit 120 may be adjusted.

At this time, the distance between the cathode unit 110 and the anode unit 120, which is adjusted by the distance adjusting unit 150, may range from 3 mm to 50 mm. Furthermore, in order to smoothly mount the work piece W on a jig and the cathode unit 110 according to the shape of the work piece W, the distance adjusting unit 150 may be spaced apart from the cathode unit 110 supported by the top of the support rod 156, and connected to a separate support (for example, a vacuum chamber or the like).

The positioning unit 140 serves to elastically support the work piece W such that the work piece W is positioned close to the bottom surface of the cathode unit 110, even though the cathode unit 110 is moved upward/downward.

The positioning unit 140 may include a first member 144, a second member 146 and a spring 148.

The first member 144 is inserted into a fixed piece 142 installed at the bottom of the anode unit 120 so as to move in the top-to-bottom direction, and extended upward.

At this time, the fixed piece 142 may be fixed to the housing (not illustrated).

The second member 146 may be formed at the top of the first member 144, and have a larger diameter than the first member 144. The top of the second member 146 may be disposed close to the cathode unit 110 while supporting the work piece W. At this time, the second member 146 may be formed of an insulating material to minimize the influence on plasma between the cathode unit 110 and the anode unit 120. The second member 146 may have various shapes such as a circular shape, rectangular shape, polygonal shape and cone shape, depending on the shape of the work piece W.

The spring 148 surrounds the outside of the first member 144, and elastically supports the second member 146 against the fixed piece 142 while the bottom thereof is supported by the fixed piece 142 and the top thereof is supported by the second member 146.

Therefore, since the work piece W supported by the second member 146 is elastically supported in the upward direction by the spring 148 at all times, the work piece W may be positioned close to the cathode unit 110 even though the cathode unit 110 is moved upward. At this time, the spring 148 may be formed of an insulating material to minimize the influence on plasma between the cathode unit 110 and the anode unit 120.

Figure 3:
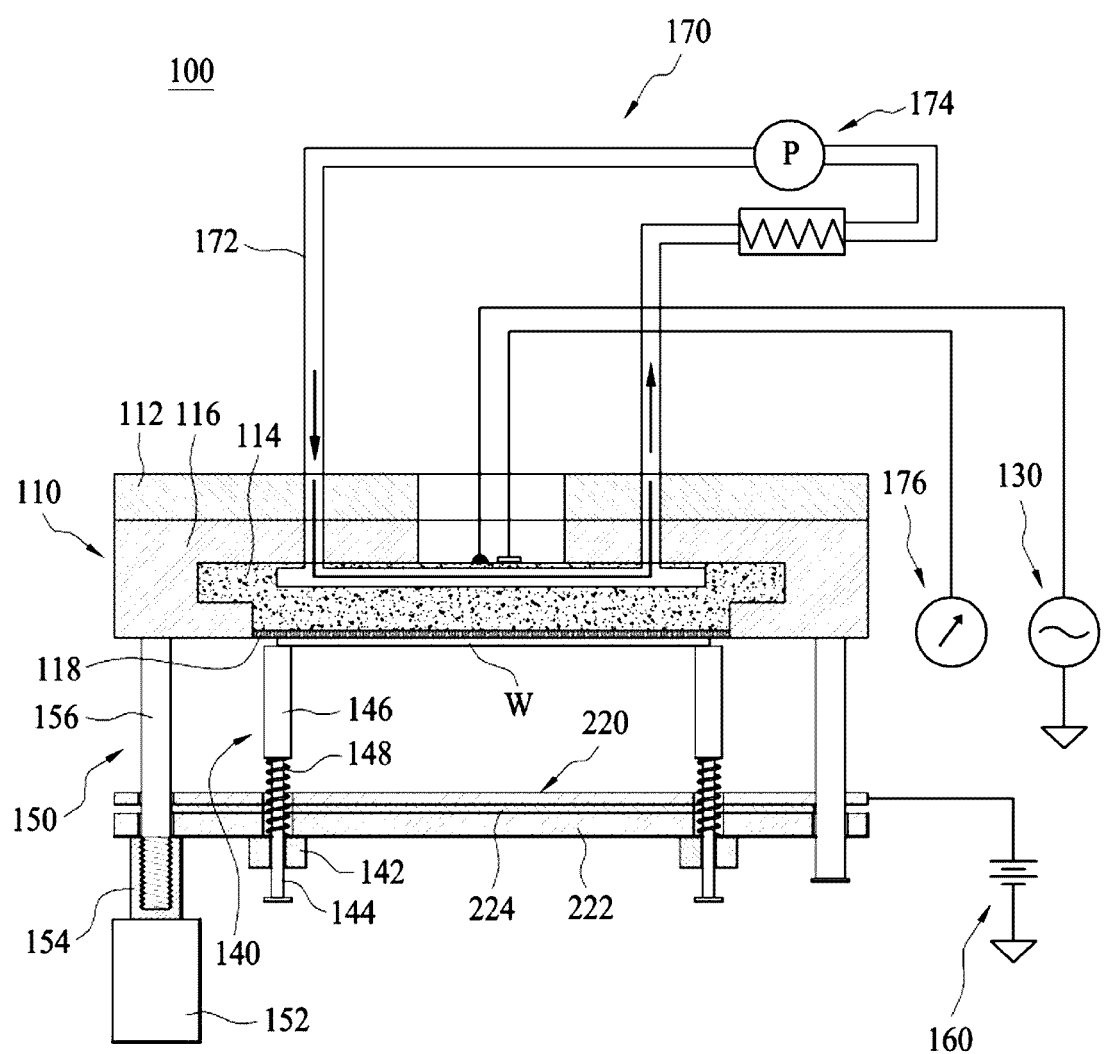
FIG. 3 is a cross-sectional view illustrating a dry etching apparatus according to another embodiment of the present invention.

As illustrated in FIG. 3, a base unit 222 for grounding may be formed at the bottom of the anode unit 120, the anode unit 120 may be installed over the base unit 222, and a second anode insulator 224 may be installed to achieve insulation between the base unit 222 and the anode unit 120.

Figure 4:
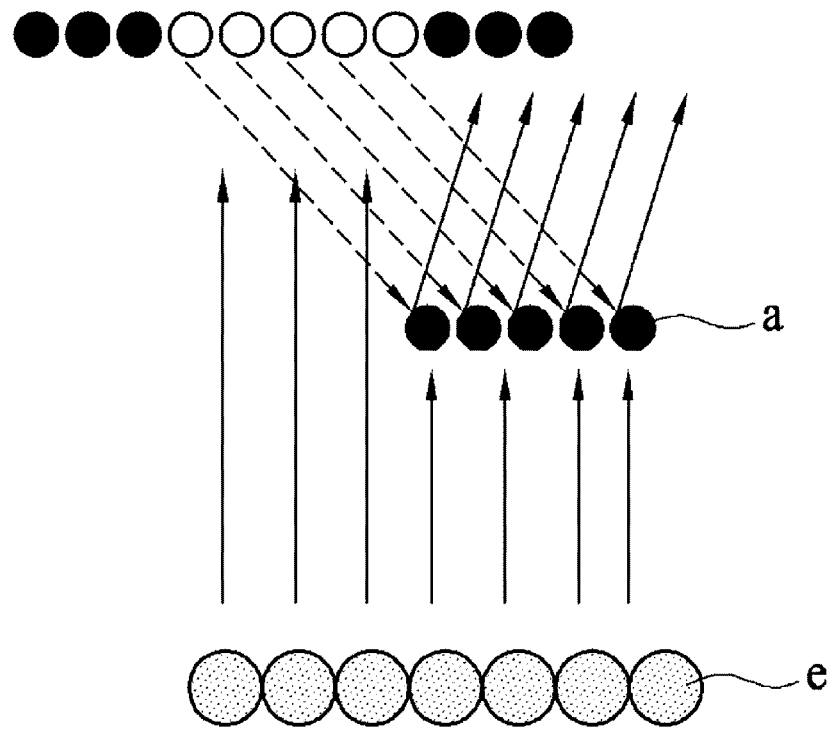
FIG. 4 illustrates that atoms a etched during a plasma etching process are rebounded by plasma ions or gas e and then redeposited.

As illustrated in FIG. 4, redeposition may occur as follows: some of atoms a separated from the surface of the work piece W through etching and falling toward the anode unit 120 hit ions i or plasma gas facing the surface of the work piece W and move toward the surface of the work piece W so as to be redeposited on the surface of the work piece W.

In order to prevent the redeposition, the dry etching apparatus according to the present embodiment may further include a DC voltage source application unit 160 which applies a negative or positive DC voltage source to the anode unit 120 in order to decrease an ion hitting time required for the work piece while increasing an electron hitting time required for the work piece. In the present embodiment, the case in which the DC voltage source application unit 160 applies a negative DC voltage source will be taken as an example for description.

Before the operation of the DC voltage source application unit 160 is described, the waveform of the voltage supplied to the cathode unit 110 by the bidirectional voltage source supply unit will be described.

Figure 5:
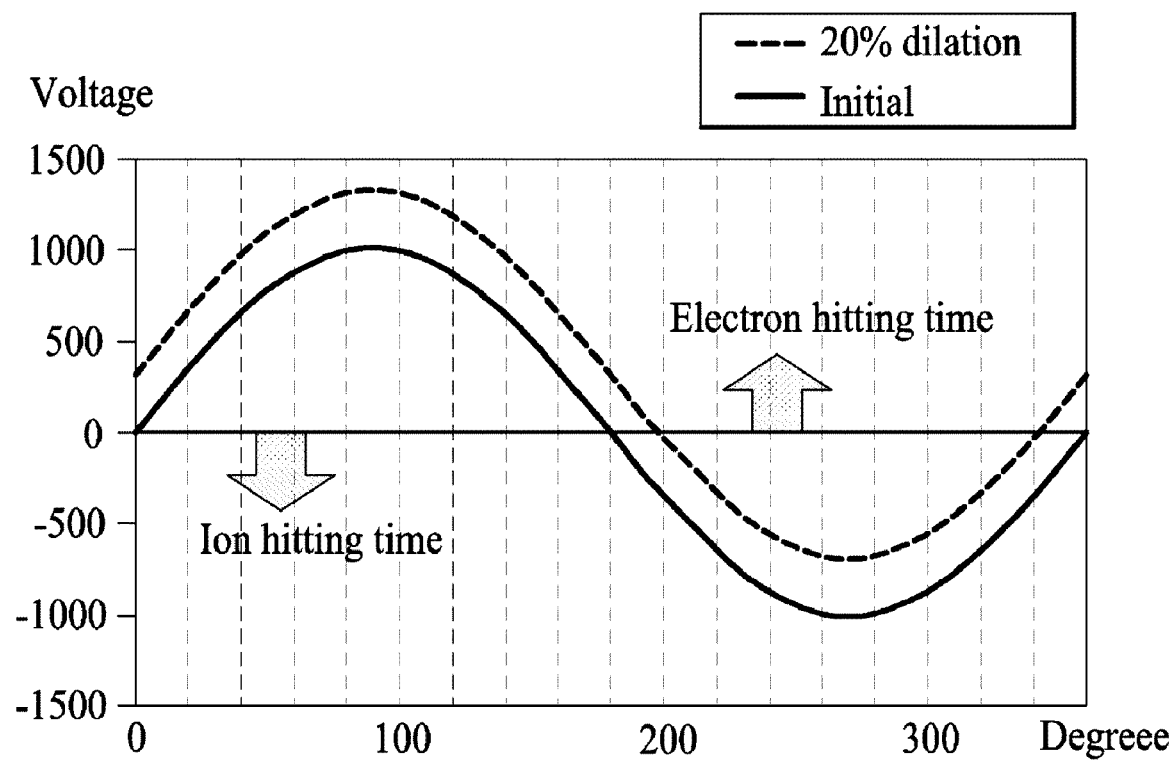
FIG. 5 is a graph illustrating that a bidirectional voltage source exhibits an AC waveform, showing a waveform change of a bidirectional voltage source formed between a cathode unit and an anode unit, when a DC voltage is applied to the anode unit.

As described above, the voltage supplied to the cathode unit may be referred to as a voltage of which the polarity alternates between + and − with time. The bidirectional voltage generated by the bidirectional voltage source supply unit 130 may exhibit a sine waveform corresponding to a general AC voltage waveform as illustrated in FIG. 5, or exhibit a trapezoidal bipolar waveform.

That is, the bidirectional voltage source according to the present embodiment may indicate a voltage of which the polarity alternates between + and − with time, based on a point at which the voltage is 0, regardless of the shape and magnitude of the waveform.

When the bidirectional voltage exhibits a trapezoidal bipolar waveform, the waveform of the voltage may include a rising section U and a falling section D.

In the waveform of the voltage, a section in which the waveform disperses negatively or positively is referred to as the rising section U, and a section in which the waveform converges to 0 is referred to as the falling section D.

Furthermore, a section in which the voltage is constantly maintained between the rising section U and the falling section D is referred to as a retention section M.

Depending on the waveform of the bidirectional voltage supplied by the bidirectional voltage source supply unit, the retention section M may appear or not.

The waveform of the bidirectional voltage source generated by the bidirectional voltage source supply unit 130 may be controlled by the control unit 190.

The control unit 190 may be implemented as a terminal or PC connected to the bidirectional voltage source supply unit 130. The present invention is not limited thereto, but the control unit 190 may be configured as a module including an input unit, a display unit, a calculation unit and a communication unit.

When the bidirectional voltage exhibits a trapezoidal bipolar waveform, the slopes and lengths of the rising section U, the falling section D and the retention section M may be controlled by the control unit 190.

That is, the slopes of the rising section U and the falling section D may appear symmetrically with each other, or appear differently from each other. Although not illustrated in the drawings, the length of the retention section M may be adjusted, and the retention section M may be controlled to appear at a voltage of 0 in addition to the peak point of the waveform.

The retention section M may be controlled by the control unit 190, depending on the time and strength required for electrons to hit the work piece W and the time and strength required for ions to hit the work piece W.

Hereafter, the operation by the DC voltage source application unit 160 will be described.

FIG. 5 is a graph illustrating a waveform change of a bidirectional voltage formed between the cathode unit 110 and the anode unit 120, when the bidirectional voltage source generated by the bidirectional voltage source supply unit 130 exhibits a sign waveform as a general AC waveform, and a DC voltage is applied to the anode unit 120.

As described above, since the waveform of the AC bidirectional voltage generated by the bidirectional voltage source supply unit 130 is applied to the cathode unit 110, the bidirectional voltage source formed between the cathode unit 110 and the anode unit 120 may exhibit an AC waveform as illustrated in FIG. 5.

However, when a negative DC voltage is applied to the anode unit 120 by the DC voltage source application unit 160, the waveform of the AC bidirectional voltage source formed between the cathode unit 110 and the anode unit 120 moves upward as illustrated in FIG. 5. In the graph of FIG. 5, ions may hit the work piece W while the AC waveform falls below the voltage of 0, and electrons may hit the work piece W while the AC waveform rises over the voltage of 0.

Even when the bidirectional voltage source generated by the bidirectional voltage source supply unit 130 exhibits a trapezoidal bipolar waveform, the bipolar waveform of the bidirectional voltage source formed between the cathode unit 110 and the anode unit 120 may move upward in the case where a negative DC voltage is applied to the anode unit 120 by the DC voltage source application unit 160. In the graph of FIG. 5, ions may hit the work piece W while the AC waveform falls below the voltage of 0, and electrons may hit the work piece W while the AC waveform of the bidirectional voltage source rises over the voltage of 0.

FIG. 5 illustrates that the waveform of the bidirectional voltage source is shifted by 20% from the original waveform.

Figure 6:
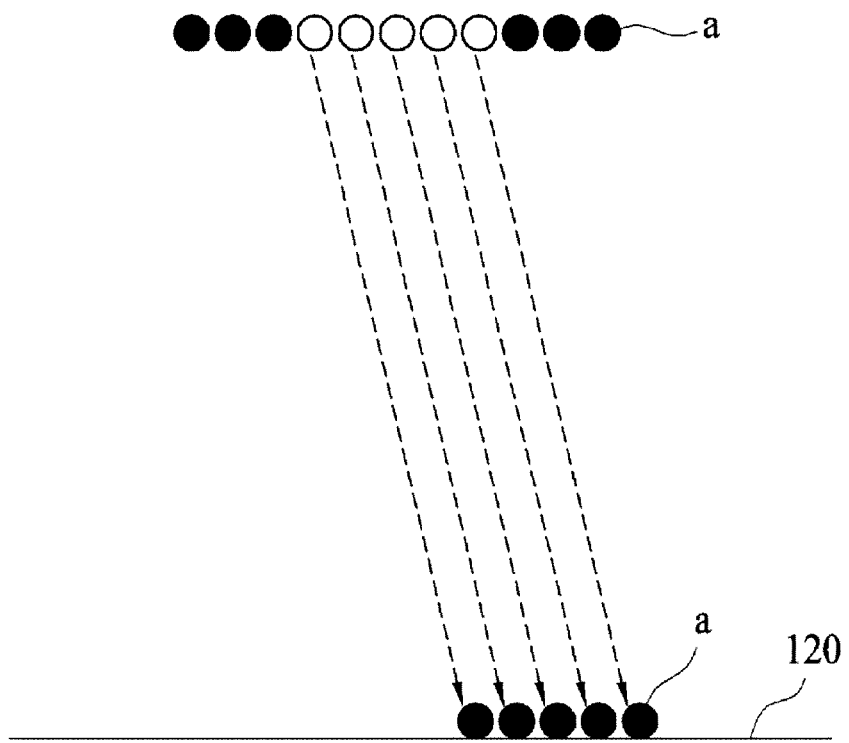
FIG. 6 illustrates that etched atoms a move, when a DC voltage is applied to the anode unit.

Therefore, as illustrated in FIG. 6, a sufficient time may be secured until atoms a separated from the surface of the work piece W through etching and falling toward the anode unit 120 reach the anode unit 120, which makes it possible to prevent redeposition.

At this time, the DC voltage source applied to the anode unit 120 by the DC voltage source application unit 160 may range from 1% to 200% of the maximum voltage of the bidirectional voltage source applied to the cathode unit 110 by the bidirectional voltage source supply unit 130.

As illustrated in FIGS. 2 and 3, the cathode unit 110 may include a first conductor 112, a second conductor 114 and a cathode insulator 116.

The first conductor 112 may be disposed at the uppermost portion, and formed of a conductor such as a grounded metal.

The second conductor 114 may be disposed at the bottom of the first conductor 112 to receive a low-frequency AC voltage from the bidirectional voltage source supply unit 130, and formed of a conductive metal such as aluminum (Al).

The cathode insulator 116 may be disposed between the first and second conductors 112 and 114 and at the outer circumference of the second conductor 114, and insulate the second conductor 114 from the outside.

The cathode insulator 116 may be formed of any materials as long as they can serve as an insulator. However, a thin insulator 118 formed at the bottom surface of the cathode unit 110, positioned close to the work piece W, may include an oxide insulator such as aluminum oxide ($Al_2O_3$) or a nitride insulator such as aluminum nitride (AlN).

At this time, the insulator positioned close to the work piece may be bonded to the portion to which the bidirectional voltage source is applied, through an integrated coating technique or a bonding technique using a bonding material with an excellent heat transfer characteristic. Therefore, temperature control may be smoothly performed while generated heat is rapidly discharged to a cooling unit. The insulator 118 may contribute to increasing the capacity of the cathode unit 110. The insulator 118 may have a thickness of 3 mm or less, and the present embodiment is not limited by the thickness of the insulator 118.

Therefore, since the insulation is achieved to block a current from flowing to the work piece W positioned close to the cathode unit 110, it is possible to prevent an increase in temperature of the work piece W.

The etching apparatus may further include a temperature control unit 170 for controlling the temperature of the cathode unit 110.

The temperature control unit 170 serves to maintain the temperature of the work piece positioned close to the cathode unit 110 within a process temperature range.

The process temperature range may indicate a temperature range which is maintained during a work process, in order to obtain a positive work result depending on the material of a work piece, the type of a work and the like.

That is, the temperature at which a work is smoothly performed during a process can be maintained to obtain the best work result of the work piece.

The temperature control unit 170 may include a cooling channel 172, a refrigerant circulating unit 174 and a temperature measurement unit 176.

The cooling channel 172 may be formed in the second conductor 114, and have the shape of a pipe through which cooling water flows. In the present embodiment, the cooling channel 172 may be extended downward from the surface of the first conductor 112 into the second conductor 114, and horizontally extended in the second conductor 114 so as to cool down the first and second conductors 112 and 114.

The refrigerant circulating unit 174 may be installed in the cooling channel 172 so as to circulate cooling water therethrough.

The temperature measurement unit 176 may serve to measure the temperature of the second conductor 114.

When the temperature rises, the separately installed control unit 190 may drive and control the refrigerant circulating unit 174 to increase the amount of circulated cooling water, such that the temperature measured by the temperature measurement unit 176 does not exceed the upper limit of the preset temperature range.

Alternatively, the control unit 190 may control the refrigerant circulating unit 174 to control the amount of circulated cooling water, such that the temperature measured by the temperature measurement unit 176 does not exceed the lower limit of the temperature range.

Therefore, the temperature control unit 170 can also control the temperature of the work piece positioned close to the cathode unit 110 while controlling the temperature of the cathode unit 110.

Hereafter, a control method for controlling the above-described dry etching apparatus will be described.

Figure 7:
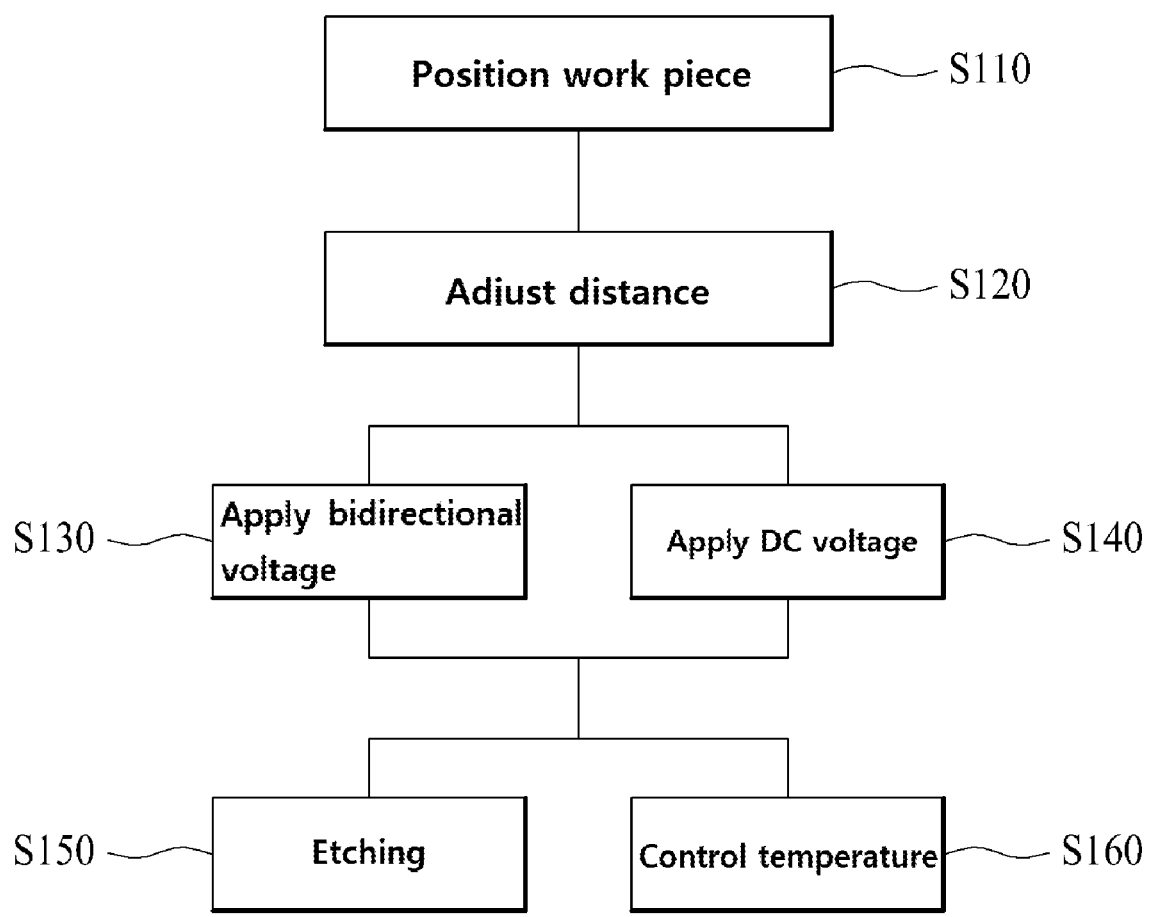
FIG. 7 is a flowchart illustrating a control method of the dry etching apparatus according to an embodiment of the present invention.

As illustrated in FIG. 7, the control method of the dry etching apparatus according to the present embodiment may include a work piece positioning step S110, a distance adjusting step S120, a bidirectional voltage source applying step S130, a DC voltage applying step S140, an etching step S150 and a temperature control step S160.

The work piece positioning step S110 is to position the work piece W close to the bottom surface of the cathode unit 110 in the housing of the dry etching apparatus. At this time, the work piece W may be positioned in such a manner that a surface of the work piece W, which needs to be etched, faces the anode unit 120 positioned at the bottom.

Therefore, while etching is performed on the bottom surface of the work piece W, atoms a separated from the surface of the work piece W through the etching may fall onto the anode unit 120 due to the gravity, which makes it possible to prevent the atoms from being redeposited on the surface of the work piece W.

At this time, the work piece W may be interposed and fixed between the positioning unit 140 and the cathode unit 110.

The distance adjusting step S120 is to adjust the distance between the cathode unit 110 and the anode unit 120 such that a plasma etching operation is performed with the optimal charge amount.

At the present step, the support rod 156 may be moved upward/downward by rotating the motor 152 through the separately installed control unit 190. Thus, while the cathode unit 110 is moved upward/downward, the distance from the anode unit 120 may be adjusted.

At this time, the distance between the cathode unit 110 and the anode unit 120 may range from 3 mm to 50 mm.

Therefore, even when an etching operation is performed on work pieces W having various shapes and areas, the distance between the cathode unit 110 and the anode unit 120 can be adjusted to the optimal distance. Thus, the etching operation can be performed with the optimal charge amount.

The bidirectional voltage source applying step S130 is to apply the bidirectional voltage source to the cathode unit 110.

At this time, the frequency of the bidirectional voltage source applied to the cathode unit 110 may be lower than 1 MHz.

The applying of the bidirectional voltage source in a relatively low frequency band can increase the charge accumulation time, thereby contributing to expanding the sheath region. Furthermore, since the time required for accelerating ions toward the work piece W can be secured, plasma ions with higher energy may hit the surface of the work piece W.

When the bidirectional voltage source is applied, the housing may be filled with gas such as argon (Ar).

The DC voltage applying step S140 may be performed at the same time as the bidirectional voltage source applying step S130, and is to apply a DC voltage to the anode unit 120. At this time, a negative or positive DC voltage may be applied to the anode unit 120. In the present embodiment, a negative DC voltage may be applied. However, the present invention is not limited thereto.

As the DC voltage is applied to the anode unit 120, the waveform of the bidirectional voltage source formed between the cathode unit 110 and the anode unit 120 may move in the positive direction as a whole, as illustrated in FIG. 5. Thus, the ion hitting time required for the work piece W may be increased, and the electron hitting time required for the work piece W may be decreased. Therefore, as illustrated in FIG. 6, a sufficient time may be secured until atoms a separated from the surface of the work piece W through etching and falling toward the anode unit 120 reach the anode unit 120, which makes it possible to prevent redeposition.

At this time, the DC voltage applied to the anode unit 120 by the DC voltage source application unit 160 may range from 1% to 200% of the maximum voltage of the AC voltage applied to the cathode unit 110 by the bidirectional voltage source supply unit 130.

While the bidirectional voltage source applying step S130 and the DC voltage applying step S140 are performed, the etching step S150 may be performed to etch the surface of the work piece W.

During the etching step S150, the temperature control step S160 may be further performed. At the temperature control step S160, when the temperature rises or drops, the separately installed control unit 190 may drive and control the refrigerant circulating unit 174 to increase or decrease the amount of circulated cooling water, such that the temperature measured by the temperature measurement unit 176 does not exceed the preset temperature range.

When the refrigerant circulating unit 174 includes a separate heater (not illustrated), the work piece may be heated through the heater in the case where the temperature measured by the temperature measurement unit 176 falls below the lower limit of the preset temperature range.

Therefore, the temperature control unit 170 can control the temperature of the work piece W positioned close to the cathode unit 110 while controlling the temperature of the cathode unit 110.

Figure 8:
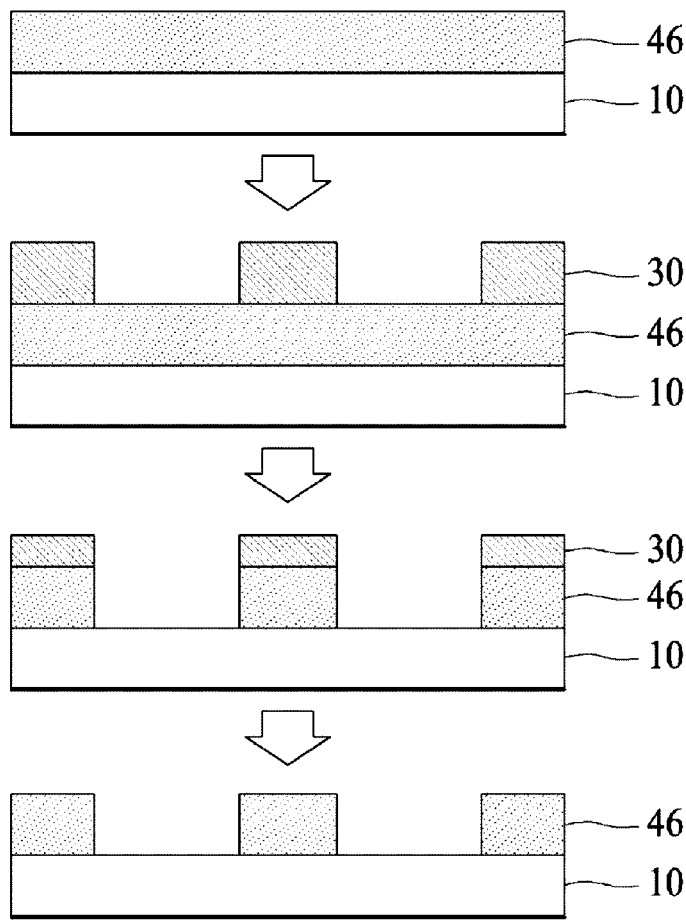
FIG. 8 illustrates a process of etching a Cu layer on a semiconductor through the dry etching apparatus and the control method thereof according to the embodiment of the present invention.

FIG. 8 illustrates a process of etching Cu on a semiconductor through the dry etching apparatus and the control method thereof according to the embodiments of the present invention.

As illustrated in FIG. 8, a PR layer 30 is formed on a work piece W having a Cu layer 46 deposited uniformly on silicon 10 through a lithography process. Then, when etching is performed through the dry etching apparatus 100 according to the present embodiment, the Cu layer 46 excluding the portion coated with the PR layer 30 through the lithography process may be all etched. Then, the process may be completed by removing the PR layer 30.

In this way, the number of steps in the etching process according to the present embodiment can be significantly reduced in comparison to the conventional dry etching process.

Figure 9:
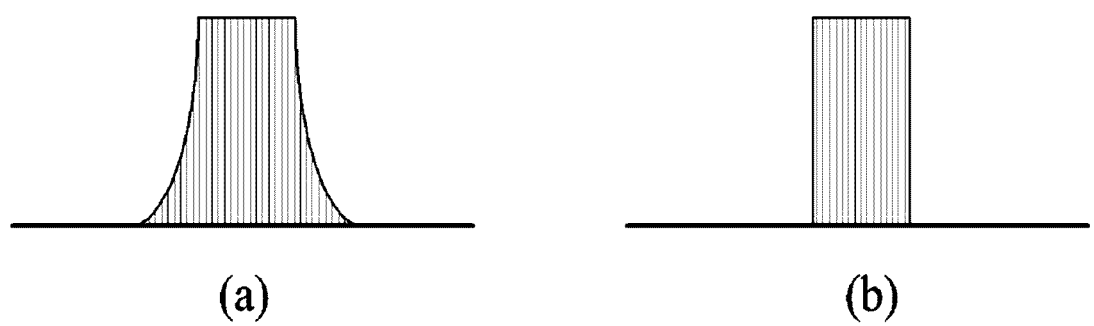
FIGS. 9A and 9B illustrate a portion etched through the conventional wet etching method and a portion etched through the dry etching apparatus and the control method thereof according to the embodiment of the present invention.

FIGS. 9A and 9B comparatively illustrate a cross-section of a portion etched through the conventional wet etching method and a cross-section of a portion etched through the dry etching apparatus and the control method thereof according to the embodiments of the present invention.

As illustrated in FIG. 9A, the conventional wet etching method has an isotropic characteristic in which etching is performed uniformly in every direction. Therefore, a portion under the PR layer is laterally etched to an extent corresponding to the thickness of the PR layer. The etched portion has the shape of a parabola in which the cross-section thereof has a thick bottom and is gradually narrowed upward. As illustrated in FIG. 9B, however, the dry etching apparatus and the control method thereof according to the embodiments of the present invention have an anisotropic characteristic. Therefore, the cross-section of the etched potion can have a clean profile in which the bottom and top thereof have the same width.

While various embodiments have been described above, it will be understood to those skilled in the art that the embodiments described are by way of example only. Accordingly, the disclosure described herein should not be limited based on the described embodiments.

The invention claimed is:

1. A control method of a dry etching apparatus, comprising:
a work piece positioning step of positioning a work piece at a bottom surface of a cathode unit, facing an anode unit, such that a surface of the work piece, on which etching is to be performed, faces the anode unit; a bidirectional voltage source applying step of applying a voltage to the cathode unit, the voltage having a polarity that alternates between a positive voltage and a negative voltage with time; a DC voltage applying step of applying a DC voltage to the anode unit to increase the time required for ions to hit the work piece and decrease the time required for electrons to hit the work piece, after or at the same time as the bidirectional voltage source applying step; and an etching step of etching the surface of the work piece using plasma generated by the bidirectional voltage source applied to the cathode unit, wherein the bidirectional voltage source applying step comprises applying a voltage having a waveform which includes a rising section in which the waveform of the voltage disperses negatively or positively, a falling section in which the waveform of the voltage converges to 0, and a retention section in which the voltage is constantly retained between the rising section and the falling section, wherein the slopes of the rising section and the falling section exhibit a bipolar waveform in which the slopes are constantly maintained; and wherein the cathode unit is above the anode unit.

2. The control method of claim 1, wherein the bidirectional voltage source applied to the cathode unit has a frequency lower than 1 MHz.

3. The control method of claim 1, further comprising a distance adjusting step of adjusting the distance between the cathode unit and the anode unit, between the work piece positing step and the bidirectional voltage source applying step.

4. The control method of claim 3, wherein the distance between the cathode unit and the anode unit, which is adjusted at the distance adjusting step, ranges from 3 mm to 50 mm.

5. The control method of claim 1, wherein the DC voltage applied at the DC voltage applying step ranges from 1% to 200% of the maximum voltage of the bidirectional voltage source applied at the bidirectional voltage source applying step.

6. The control method of claim 1, further comprising a temperature control step of controlling the temperature of the cathode unit.

* * * * *